United States Patent
Hashimoto

(10) Patent No.: US 10,206,320 B2
(45) Date of Patent: Feb. 12, 2019

(54) COMPONENT MOUNTER

(71) Applicant: FUJI CORPORATION, Chiryu-shi (JP)

(72) Inventor: Mitsuhiro Hashimoto, Nagoya (JP)

(73) Assignee: FUJI CORPORATION, Chiryu-shi (JP)

( * ) Notice: Subject to any disclaimer, the term of this patent is extended or adjusted under 35 U.S.C. 154(b) by 21 days.

(21) Appl. No.: 15/511,104

(22) PCT Filed: Sep. 30, 2014

(86) PCT No.: PCT/JP2014/076171
§ 371 (c)(1),
(2) Date: Mar. 14, 2017

(87) PCT Pub. No.: WO2016/051533
PCT Pub. Date: Apr. 7, 2016

(65) Prior Publication Data
US 2017/0280600 A1 Sep. 28, 2017

(51) Int. Cl.
*H05K 13/08* (2006.01)
*H05K 13/04* (2006.01)

(52) U.S. Cl.
CPC ............ *H05K 13/08* (2013.01); *H05K 13/04* (2013.01); *H05K 13/0404* (2013.01); *H05K 13/083* (2018.08)

(58) Field of Classification Search
CPC ........... H05K 13/0818; H05K 13/0812; H05K 13/082; H05K 13/083
See application file for complete search history.

(56) References Cited

U.S. PATENT DOCUMENTS

| | | | |
|---|---|---|---|
| 6,256,876 B1 * | 7/2001 | Ohe | H01C 17/242 29/832 |
| 2004/0080897 A1 * | 4/2004 | Kodama | H05K 13/0452 361/234 |

(Continued)

FOREIGN PATENT DOCUMENTS

JP 2009-4714 A 1/2009

OTHER PUBLICATIONS

International Search Report dated Dec. 9, 2014, in PCT/JP2014/076171 filed Sep. 30, 2014.

*Primary Examiner* — Peter DungBa Vo
*Assistant Examiner* — Jeffrey Carley
(74) *Attorney, Agent, or Firm* — Oblon, McClelland, Maier & Neustadt, L.L.P.

(57) ABSTRACT

A component mounter is provided with a characteristic value measuring device that measures a characteristic value of first component, and head that mounts each of first component and second component on board. Second component is a digital potentiometer provided with receiver section that receives information from head, variable resistance section for which the resistance is variable, and control section that controls the resistance value of variable resistance section. Head is provided with receiver section that receives information from characteristic value measuring device, sender section that sends information to second component, power source that supplies electric current to variable resistance section, memory section that memorizes the resistance value of second component according to the characteristic value of first component, and control section.

6 Claims, 8 Drawing Sheets

| First component | Second component |
|---|---|
| Capacitor | Digital potentiometer |
| Electrostatic capacity value | Resistance value |
| 10 | 100 |
| 20 | 200 |
| 30 | 300 |
| ⋮ | ⋮ |

(56) References Cited

U.S. PATENT DOCUMENTS

| | | | |
|---|---|---|---|
| 2005/0117312 A1* | 6/2005 | Kimura | H05K 1/186 |
| | | | 361/746 |
| 2006/0018104 A1* | 1/2006 | Katayama | H05K 1/0239 |
| | | | 361/782 |
| 2006/0139044 A1* | 6/2006 | Park | G01R 1/0408 |
| | | | 324/763.01 |
| 2010/0071195 A1* | 3/2010 | Kihara | H05K 13/0069 |
| | | | 29/593 |
| 2014/0218883 A1* | 8/2014 | Dakhiya | H01L 23/5384 |
| | | | 361/761 |
| 2015/0089801 A1* | 4/2015 | Cho | H05K 13/0417 |
| | | | 29/705 |

* cited by examiner

| First component | Second component |
|---|---|
| Capacitor | Digital potentiometer |
| Electrostatic capacity value | Resistance value |
| 10 | 100 |
| 20 | 200 |
| 30 | 300 |
| ... | ... |

COMPONENT MOUNTER

TECHNICAL FIELD

The technology disclosed in the present application relates to a component mounter that mounts components on a board.

BACKGROUND ART

A component mounter is disclosed in patent literature 1 (JP-A-2009-004714). The component mounter disclosed in patent literature 1 is provided with a head that has a nozzle. The head uses the nozzle to hold a component and mount the held component on a board. The head mounts multiple components on the board.

SUMMARY OF INVENTION

Problem to be Solved

When mounting multiple components on a board, if the compatibility of respective components is not good, the components may not function well. For example, in a case in which a characteristic value (for example, an electrostatic capacity value) of one component is a value not appropriate for a characteristic value (for example, a resistance value) of another component, one of the components may not function correctly. Thus, an object of the present disclosure is to provide a component mounter that, in a case of mounting a first component and a second component which affect a given characteristic of each other on a board, allows the mounted first component and second component to function satisfactorily.

Means for Solving the Problem

The component mounter disclosed herein is a device that mounts at least two components, a first component and a second component, onto the same board. The component mounter is provided with a characteristic value measuring device that measures a characteristic value of the first component, and a head that mounts each of the first component and second component on the board. The second component is a digital potentiometer provided with a receiver section that receives information from the head, a variable resistance section for which the resistance is variable, and a control section that controls the resistance value of the variable resistance section. The head is provided with a receiver section that receives information from a characteristic value measuring device, a sender section that sends information to the second component, a power source that supplies electric current to the variable resistance section, a memory section that memorizes the resistance value of the second component according to the characteristic value of the first component, and a control section. The control section of the head receives a characteristic value of the first component measured by the characteristic value measuring device from the characteristic value measuring device via the receiver section, identifies the resistance value of the second component from the memory section based on the received characteristic of the first component, and sends the identified resistance value of the second component to the second component via the sender section. The power source of the head supplies electric current to the variable resistance section of the second component. The control section of the head, with respect to the control section of the second component, receives the resistance value of the second component received from the head via the receiver section of the second component, and with electric current flowing in the variable resistance section, adjusts the resistance value of the variable resistance section based on the received resistance value of the second component.

According to such a configuration, when mounting each of the first component and the second component on the board, it is possible to mount a second component with a resistance value that corresponds to a characteristic value of the first component. Thus, a second component appropriate to the first component mounted on the board can be mounted on the same board. When the first component and the second component are mounted on the same board, the first component is affected by the resistance value of the second component. For example, if the resistance value of the second component is high, there are cases in which the current flowing through the first component becomes low. In this case, if the compatibility of the characteristic of the first component and the resistance value of the second component is not good, the first component may not function well. For example, if the resistance value of the second component is too high, the current flowing through the first component will be too low, in some cases leading to the first component functioning poorly. However, with the above component mounter, because the resistance value of the second component is adjusted based on a characteristic value of the first component, the first component functions well. Also, in a similar manner, the second component functions well. Thus, the first component and the second component mounted on the board are able to function well. Further, the control section of the head receives the characteristic value of the first component from the characteristic value measuring device, and the resistance value of the second component is adjusted based on that characteristic value. Because processing can be performed only with the control section of the head, it is possible to perform mounting work of the first component and the second component efficiently in a short time.

DESCRIPTION OF EMBODIMENTS

The main features of an embodiment are described below. Note that the technical elements described herein are each independent elements and exhibit utility either independently or in various combinations with each other.

(Feature 1) The head may be provided with a power source probe connected to a power source. The second component may be provided with a power source terminal connected to a variable resistance section. When the power source probe contacts the power source terminal, current may flow from the power source to the variable resistance section.

(Feature 2) An RF tag may be attached to the board. The control section of the head may write the characteristic value of the first component and the resistance value of the second component onto the RF tag.

(Feature 3) The memory section of the head may memorize a table in which the resistance value of the second component corresponding to the characteristic value of the first component is set in advance.

(Feature 4) The characteristic measuring section may be provided with a communication pad that sends the characteristic value of the first component. The head may be provided with a receiver probe connected to the receiver section. When the receiver probe contacts the communication pad, the characteristic value of the first component may be sent from the characteristic value measuring device to the head.

(Feature 5) The head may be provided with a sender probe connected to the sender section. The second component may be provided with a receiver terminal connected to the receiver section. When the sender probe contacts the receiver terminal, the resistance value of the second component may be sent from the head to the second component.

Figure 1:
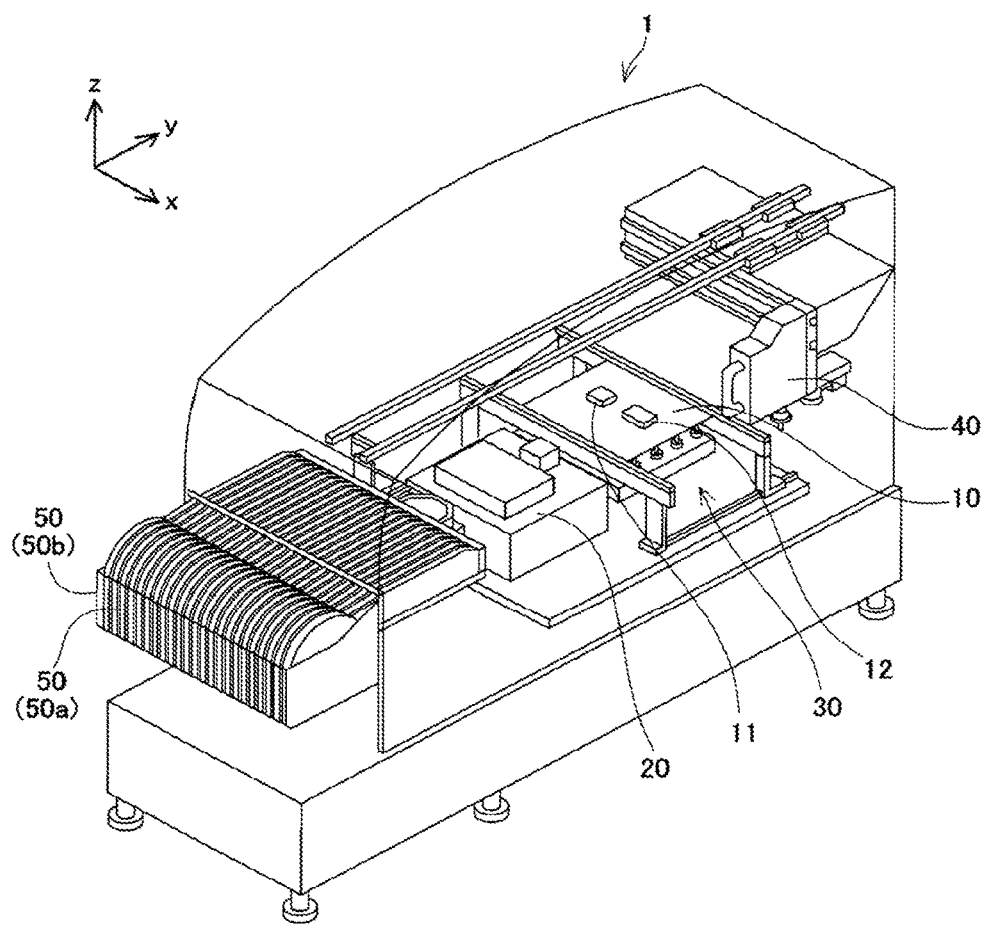
FIG. 1 is a perspective view showing the schematic configuration of a component mounter.
Figure 2:
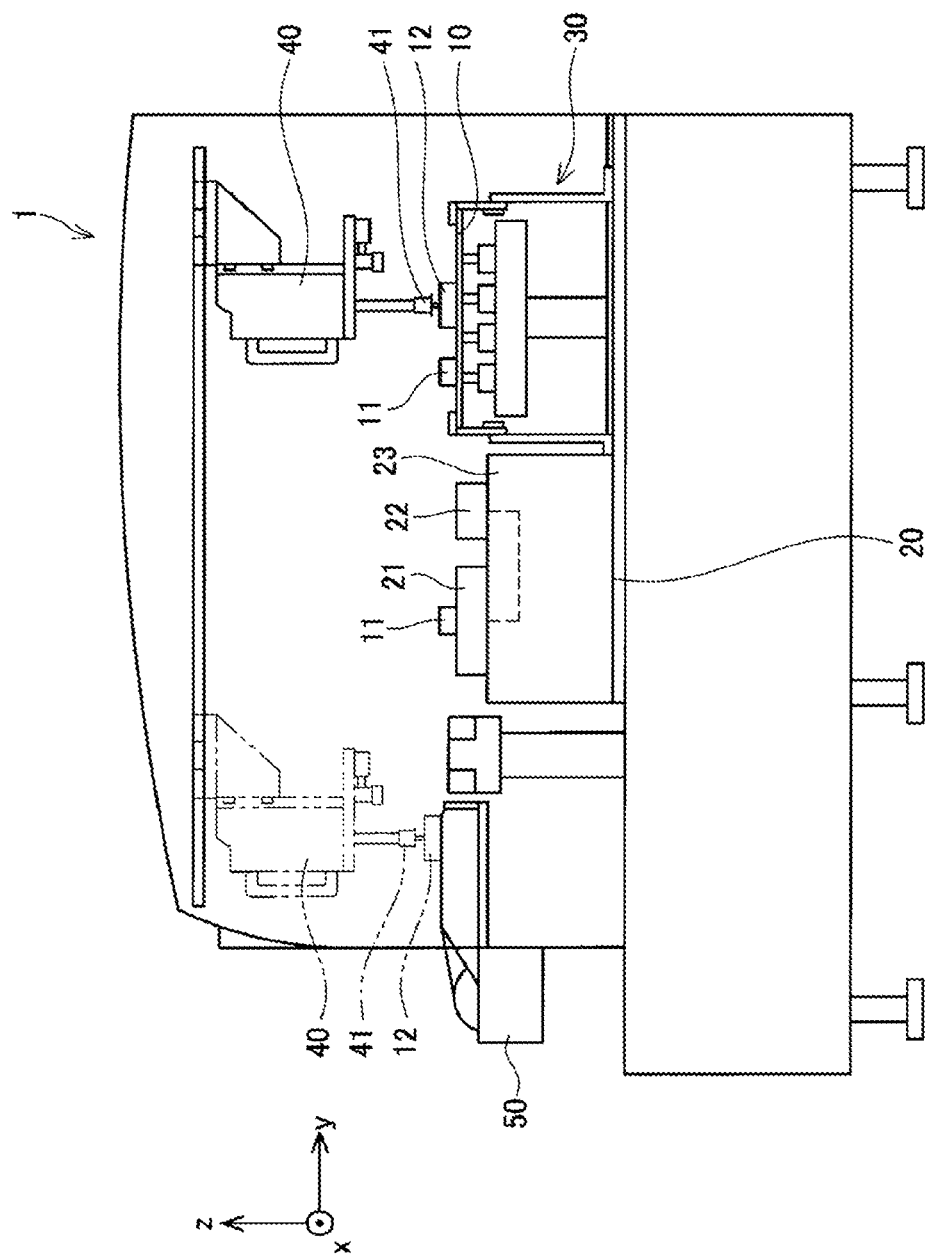
FIG. 2 is a side view showing the schematic configuration of a component mounter.

Embodiments are described below with reference to the attached drawings. As shown in FIGS. 1 and 2, an embodiment, component mounter 1, is provided with characteristic value measuring device 20, head 40, feeders 50, and conveyor 30. Component mounter 1 is a device that mounts first component 11 and second component 12 on board 10.

Without being particularly limited, for first component 11, an electronic component, for example, a sensor, capacitor, memory, or LED, may be used. First component 11 has a characteristic value. The characteristic value of first component 11 may be various different things depending on the configuration of the first component 11. For example, the characteristic value may be an electrically characteristic value such as resistance, capacitance, inductance, impedance, brightness, and so on. In the present embodiment, a capacitor is used as first component 11, and capacitance is used as the characteristic value of the first component 11.

Figure 3:
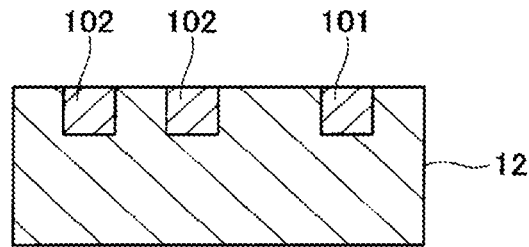
FIG. 3 is a cross section of a second component.
Figure 4:
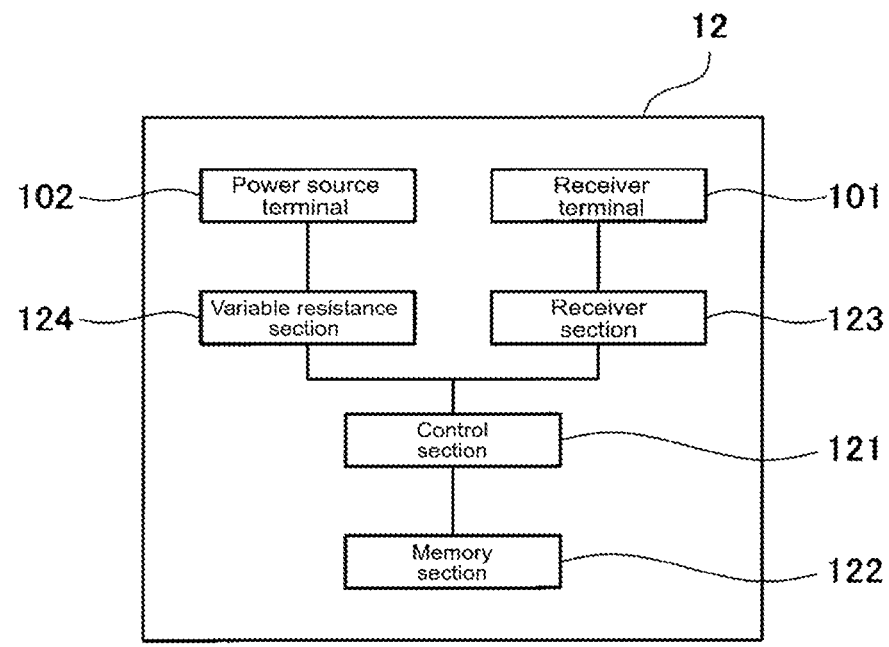
FIG. 4 is a block diagram of the second component.

A digital potentiometer may be used as second component 12. Second component 12 has a resistance value. The resistance value of second component 12 is variable. As shown in FIG. 3, second component 12 is provided with receiver terminal 101, and pair of power source terminals 102 and 102. Further, as shown in FIG. 4, second component 12 is provided with receiver section 123, variable resistance section 124, memory section 122, and control section 121.

Receiver terminal 101 is formed from metal, and is formed in a range exposed on the surface of second component 12. The pair of power source terminals 102 and 102 are formed from metal, and are formed in a range exposed on the surface of second component 12. The pair of power source terminals 102 and 102 are connected to variable resistance section 124.

Receiver section 123 is connected to receiver terminal 101. Receiver section 123 receives information via receiver terminal 101. Information that receiver section 123 receives is, for example, sent from head 40.

Variable resistance section 124 is connected to the pair of power source terminals 102 and 102. Electric current flows in variable resistance section 124 for which the resistance is variable via the pair of power source terminals 102 and 102. The electric current that flows through variable resistance section 124 may be supplied from head 40.

Memory section 122 memorizes the resistance value of second component 12. Control section 121 controls the resistance value of variable resistance section 124. Control section 121 controls the resistance value of variable resistance section 124 based on information memorized in memory section 122.

As shown in FIG. 2, characteristic value measuring device 20 is provided with base 23, measurement stage 21, and communication pad 22. Base 23 supports measurement stage 21 and communication pad 22.

Measurement stage 21 is arranged on base 23. First component 11 is arranged on measurement stage 21. Measurement stage 21 is provided with a probe card (not shown) and is configured to allow the characteristic value of the first component 11 arranged on measurement stage 21 to be measured. The probe card is provided with multiple probes and the configuration is such that the electrically characteristic value of an electronic component is measurable via the multiple probes.

Communication pad 22 is arranged on base 23. Communication pad 22 is arranged next to measurement stage 21. Communication pad 22 is electrically connected to measurement stage 21. Communication pad 22 sends the characteristic value of the first component measured at measurement stage 21 to head 20.

Figure 5:
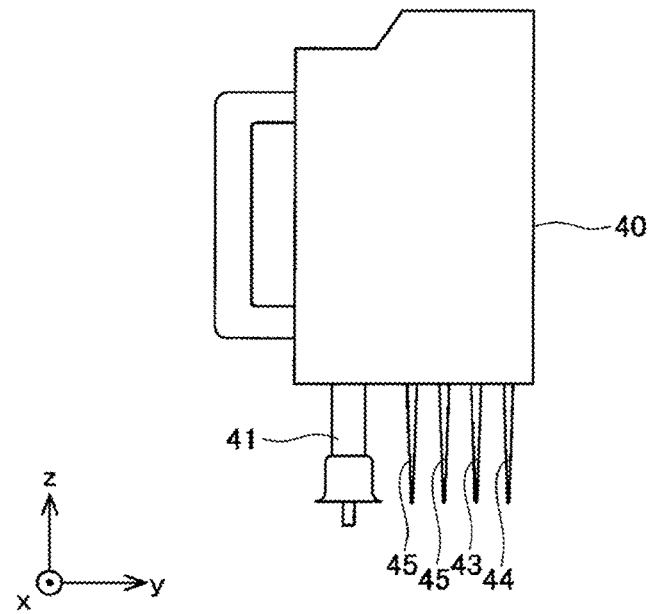
FIG. 5 is shows the schematic configuration of a head.
Figure 6:
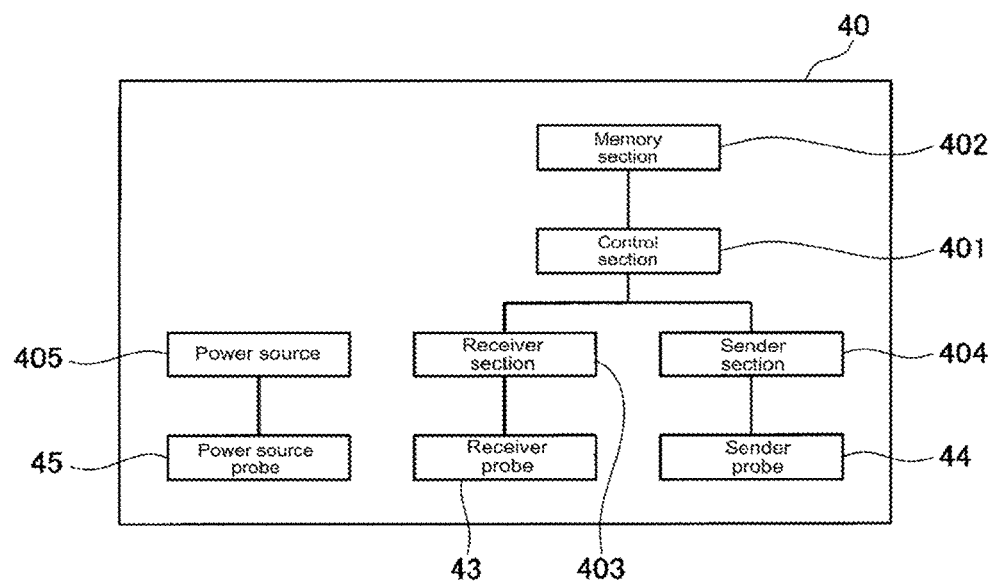
FIG. 6 is a block diagram of the head.

As shown in FIG. 5, head 40 is provided with nozzle 41, receiver probe 43, sender probe 44, and pair of power source probes 45 and 45. Further, as shown in FIG. 6, head 40 is provided with receiver section 403, sender section 404, power source 405, memory section 402, and control section 401.

Nozzle 41 is configured to move up and down in the z direction with respect to the head main body. Nozzle 41 is able to hold each of first component 11 and second component 12. Specifically, nozzle 41 is configured to vacuum-hold a component at its tip section, so as to hold each of first component 11 and second component 12. Head 40 picks up and holds first component 11 or second component 12 from feeder 50 using nozzle 41, and transports the held component to board 10. Further, nozzle 41 mounts the held first component 11 or second component 12 on board 10.

Receiver probe 43 and sender probe 44 are needles formed from metal. Receiver probe 43 and sender probe 44 are each configured to move up and down in the z direction with respect to the head main body. Receiver probe 43, when moved down, contacts communication pad 22 of characteristic value measuring device 20. When receiver probe 43 and communication pad 22 contact, communication is possible between head 40 and characteristic value measuring device 20. Sender probe 44, when moved down, contacts receiver terminal 101 of second component 12. When sender probe 44 and receiver terminal 101 contact, communication is possible between head 40 and second component 12. Receiver probe 43 is connected to receiver section 403. Sender probe 44 is connected to sender section 404.

The pair of power source probes 45 and 45 are needles formed from metal. The pair of power source probes 45 and 45 are configured to move up and down in the z direction with respect to the head main body. The pair of power source probes 45 and 45, when moved down, are connected to the pair of power source terminals 102 and 102 of second component 12. When the pair of power source probes 45 and 45 contact the pair of power source terminals 102 and 102, head 40 and second component 12 are electrified. The pair of power source probes 45 and 45 are connected to power source 405.

Receiver section 403 is connected to receiver probe 43. Receiver section 403 receives information via receiver probe 43. Information that receiver section 403 receives is sent from characteristic value measuring device 20. Specifically, receiver section 403 receives the characteristic value of first component 11 sent from characteristic value measuring device 20.

Sender section 404 is connected to sender probe 44. Sender section 404 sends information via sender probe 44. Information that sender section 404 sends is received by the second component. Specifically, receiver section 404 sends the resistance value of second component 12 to the second component.

Power source 405 is connected to the pair of power source probes 45 and 45. Electric current flows from power source 405 via the pair of power source probes 45 and 45. Current that flows from power source 405 is supplied to second component 12.

Figures 7, 8:
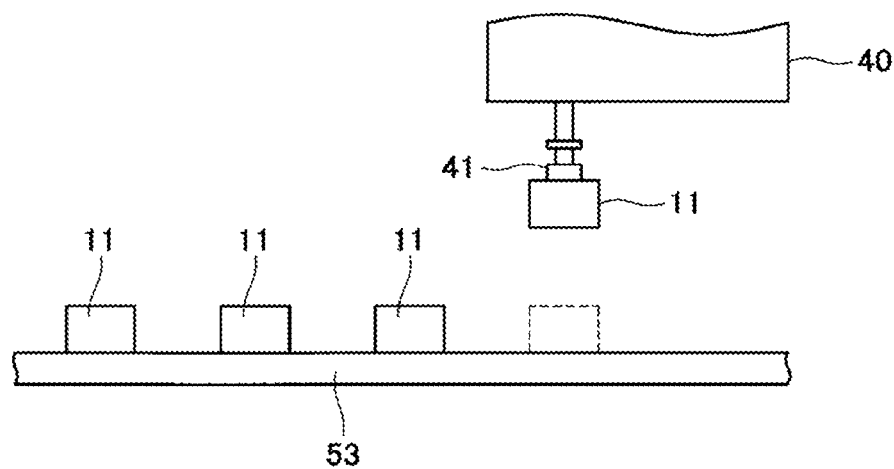
FIG. 7 shows a table memorized in the memory section of the head.
FIG. 8 illustrates operation of the component mounter (1).

Memory section 402 memorizes each type of information. Memory section 402 memorizes, for example, a program for controlling operation of head 40. Memory section 402, for example, is provided with well-known RAM and ROM, and memorizes information using RAM and ROM. As shown in FIG. 7, memory section 402 memorizes a table in which resistance values of second components 12 corresponding to the characteristic value of first components 11 are set in advance. This table registers a link between a characteristic value of first component 11 and the resistance value of second component 12. In the present embodiment, the capacitance value (characteristic value) of the capacitor (first component 11) and the resistance value of the digital potentiometer (second component 12) correspond. Based on this table, a resistance value of second component 12 corresponding to the characteristic of first component 11 is identified.

Control section 401 controls operation of head 40. Control section 401 controls head 40 based on information memorized in memory section 402, and information communicated by receiver section 403 and sender section 404 (including information sent from the main body side of component mounter 1). Control section 401, for example, is provided with a well-known CPU and performs information processing using the CPU. Details regarding control via control section 401 are described later.

As shown in FIG. 2, conveyor 30 is arranged next to characteristic value measuring device 20. Conveyor 30 conveys and holds board 10 for mounting first component 11 and second component 12. Conveyor 30 conveys multiple boards 10 consecutively at a specified interval and holds board 10 while first component 11 and second component 12 are being mounted on board 10.

As shown in FIG. 1, first feeder 50a and second feeder 50b are included in feeders 50. First feeder 50a supplies first component 11. Second feeder 50b supplies second component 12. First feeder 50a and second feeder 50b are configured the same except for the component to supply. Feeders 50 (first feeder 50a and second feeder 50b) are tape feeders, and consecutively supply multiple components (first component 11 or second component 12) arranged lined up in tape by advancing the tape (refer to FIGS. 8 and 11). Note that, multiple feeders 50 other than first feeder 50a and second feeder 50b are provided on component mounter 1. These feeders 50 also supply components, and these supplied components are mounted on board 10 by component mounter 1. However, with the present embodiment, because special features apply to the mounting of first component 11 and second component 12, below, operation when mounting first component 11 and second component 12 is described.

Figure 9:
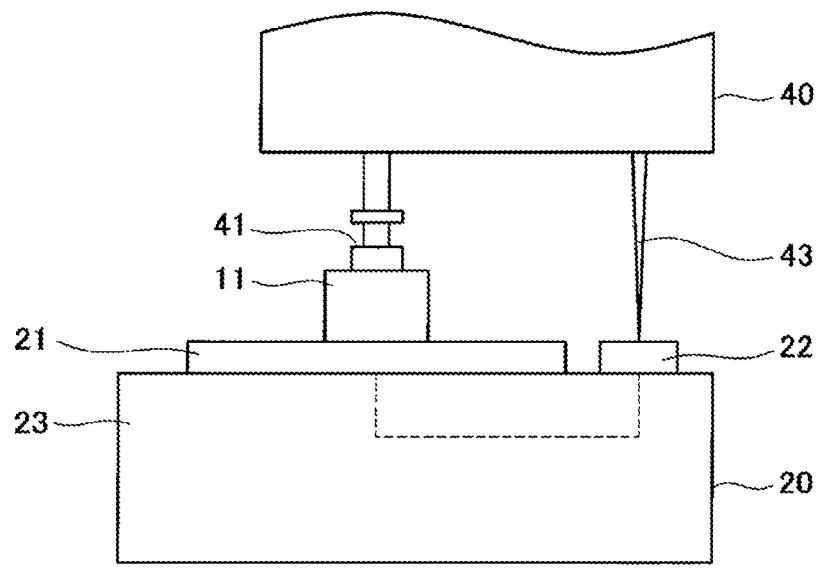
FIG. 9 illustrates operation of the component mounter (2).

Described next is operation of a component mounter provided with the above configuration. With the above component mounter 1, first, as shown in FIG. 8, head 40 moves and holds first component 11 supplied from tape 53 of first tape feeder 50a. In more detail, nozzle 41 of head 40 picks up first component 11 arranged in tape 53. Then, as shown in FIG. 9, head 40 conveys the held first component 11 to characteristic value measuring device 20. Head 40 is arranged above measurement stage 21 of characteristic value measuring device 20 that measures transported first component 11. Further, when first component 11 is arranged on measurement stage 21, receiver probe 43 of head 40 moves down so as to contact communication pad 22 of characteristic value measuring device 20.

Continuing, measurement stage 21 of characteristic value measuring device 20 measures the characteristic value of first component 11 arranged on measurement stage 21. In the present embodiment, a capacitor is used as first component 11, and measurement stage 21 measures capacitance as the characteristic value of first component 11.

Continuing, the characteristic value of first component 11 measured at measurement stage 21 is sent to head 40 via communication pad 22 and receiver probe 43. Control section 401 of head 40 receives the characteristic value first component 11 sent from characteristic value measuring device 20 by receiver probe 43 and receiver section 403. Also, control section 401 of head 40 memorizes the characteristic value of received first component 11 on memory section 402.

Figure 10:
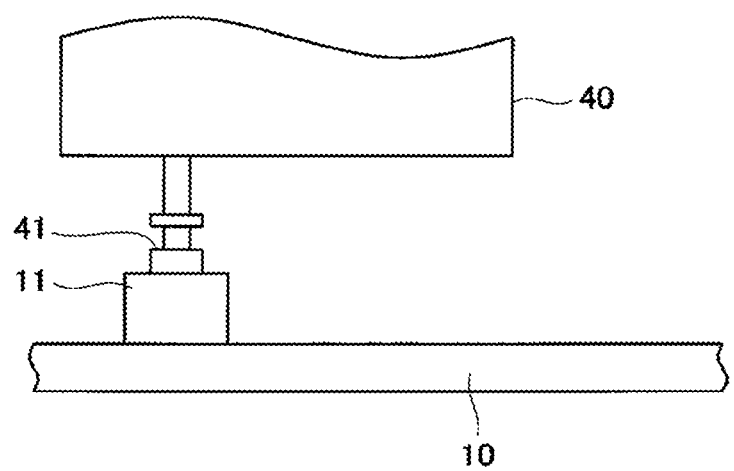
FIG. 10 illustrates operation of the component mounter (3).

Continuing, as shown in FIG. 10, head 40 transports held first component 11 from characteristic value measuring device 20 to board 10. And, head 40 mounts the transported first component 11 on board 10.

Next, control section 401 of head 40 identifies the resistance value of second component 12 corresponding to the characteristic value of first component 11 based on the table memorized in memory section 402 (refer to FIG. 7). In the present embodiment, the resistance value of a potentiometer corresponding to the capacitance value of a capacitor is identified.

Figure 11:
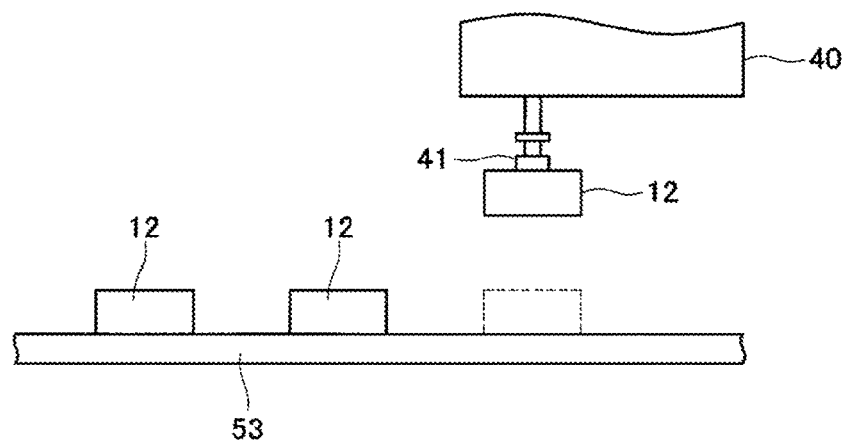
FIG. 11 illustrates operation of the component mounter (4).
Figure 12:
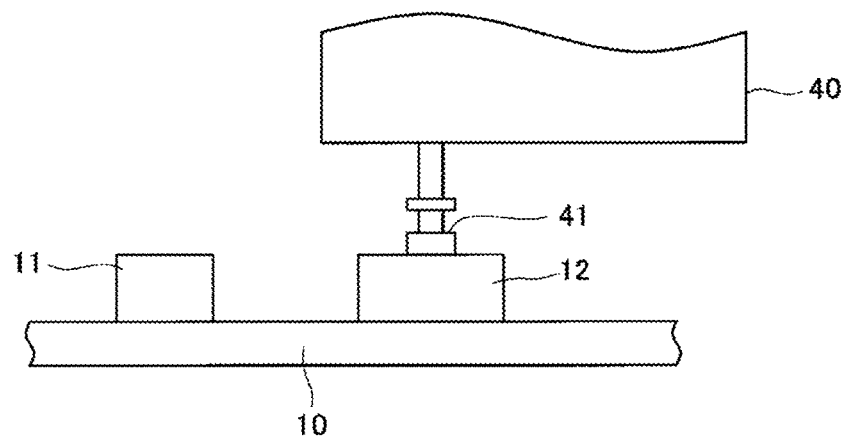
FIG. 12 illustrates operation of the component mounter (5).

Continuing, as shown in FIG. 11, head 40 moves and holds second component 12 supplied from tape 53 of second feeder 50b. In more detail, nozzle 41 of head 40 picks up second component 12 arranged in tape 53. Then, as shown in FIG. 12, head 40 conveys the held second component 12 to board 10. And, head 40 mounts the transported second component 12 on board 10. Second component 12 is electrically connected to first component 11.

Figure 13:
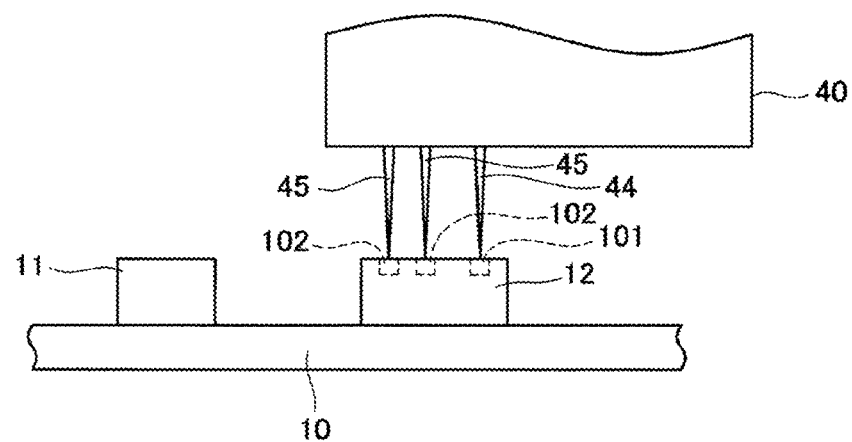
FIG. 13 illustrates operation of the component mounter (6).

As shown in FIG. 13, when second component 12 is mounted on board 10, the pair of power source probes 45 and 45 of head 40 move down so as to contact the pair of power source terminals 102 and 102 of second component 12. Further, when second component 12 is mounted on board 10, receiver probe 44 of head 40 moves down and contacts receiver terminal 101 of second component 12.

When the pair of power source probes 45 and 45 contact the pair of power source terminals 102 and 102, electric current flows from power source 405 of head 40 through variable resistance section 124 of second component 12 mounted on board 10 via the pair of power source probes 45 and 45 and the pair of power source terminals 102 and 102. Accordingly, variable resistance section 124 is electrified.

Also, when receiver probe 44 contacts receiver terminal 101, control section 401 of head 40 sends information to second component 12 via receiver section 404. In more detail, control section 401 of head 40 sends the resistance value of second component 12 identified based on the table shown in FIG. 7 to second component 12.

When the resistance value of second component 12 is sent to second component 12, control section 121 of second component 12 receives the resistance value of that second component 12 via receiver section 123. Also, control section 121 of second component 12 memorizes the received resistance value of second component 12 on memory section 122. Further, control section 121 of second component 12 adjusts the resistance value of variable resistance section 124 based on the resistance value of second component 12 memorized in memory section 122. Control section 121 of second component 12 adjusts the resistance value of variable resistance section 124 in a state with electric current flowing through variable resistance section 124. In this manner, the resistance value of second component 12 is adjusted according to the characteristic value of first component 11

As is clear from the descriptions above, with the above component mounter 1, second component 12 is a digital potentiometer. Also, characteristic value measuring device 20 measures a characteristic value of first component 11. Also, head 40 mounts each of first component 11 and second component 12 on board 10. Control section 401 of head 40 receives a characteristic value of first component 11 measured by characteristic value measuring device 20 from characteristic value measuring device 20 via receiver section 403, identifies the resistance value of second component 12 based on the received characteristic of first component 11, and sends the identified resistance value of second component 12 to second component 12 via sender section 404. Further, power source 405 of head 40 supplies electric current to variable resistance section 124 of second component 12. Control section 401 of head 40, with respect to control section 121 of second component 12, receives the resistance value of second component 12 received from head 40 via receiver section 123, and with electric current flowing in variable resistance section 124, adjusts the resistance value of variable resistance section 124 based on the received resistance value of second component 12. According to such a configuration, it is possible to identify the resistance value of second component 12 corresponding to the characteristic value of first component 11, and to adjust the resistance value of variable resistance section 124 of second component 12 based on the resistance value. Thus, it is possible to mount second component 12 with a resistance value that corresponds to the characteristic of first component 11 on board 10. Therefore, it is possible to mount a second component appropriate to the characteristic value of the first component on board 10.

When the first component and the second component are mounted on the same board, the first component is affected by the resistance value of the second component. For example, if the resistance value of the second component is high, there are cases in which the current flowing through the first component becomes low. If the compatibility of the characteristic of the first component and the resistance value of the second component is not good, the first component may not function well. For example, if the resistance value of the second component is too high, the current flowing through the first component will become low, in some cases leading to the first component functioning poorly. However, with the above component mounter 1, because a second component 12 with a resistance value that corresponds to the characteristic value of first component 11 is mounted on board 10, first component 11 functions well. Also, in a similar manner, second component 12 functions well.

Also, with the above component mounter 1, the series of processing from receipt of the characteristic value of first component 11 up to adjustment of the characteristic value of second component 12 is performed by control section 401 of head 40. That is, receipt of the measurement result sent from characteristic value measuring device 20, determination of the characteristic value of second component 12 based on the received measurement result, and adjustment of the characteristic value of second component 12 based on the determined characteristic value are performed by control section 401 of head 40. Because processing is performed by only control section 401 of head 40, mounting work of first component 11 and second component 12 can be performed efficiently in a short time. Also, the control section of the main body side of component mounter does not need to perform receipt of the measurement result sent from characteristic value measuring device 20, determination of the characteristic value of second component 12 based on the received measurement result, or adjustment of the characteristic value of second component 12 based on the determined characteristic value. Therefore, the control section of the main body side of component mounter 1 is able to perform other processing while control section 401 of head 40 is performing the above processing, such that the processing time for mounting components (including first component 11 and second component 12) from multiple feeders 50 can be made shorter.

Figure 14:
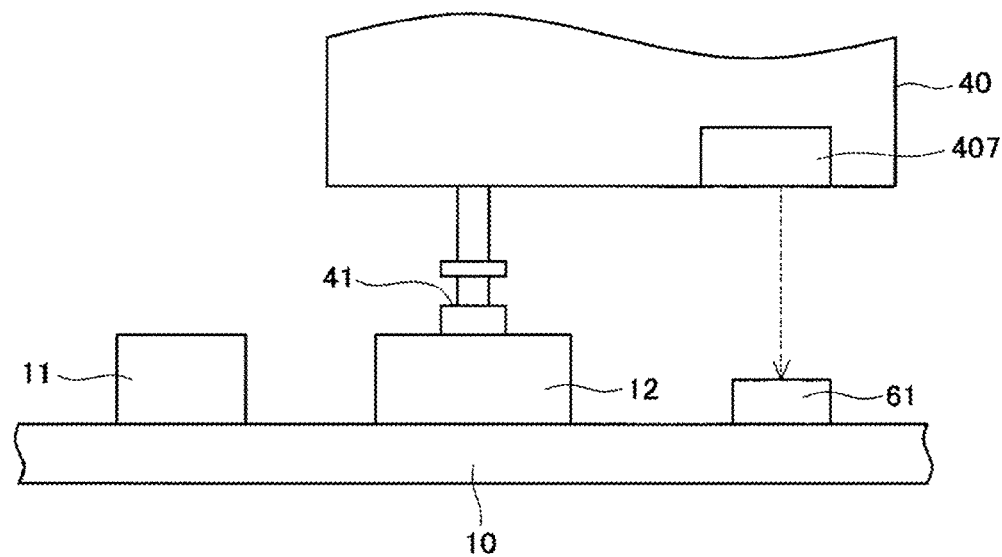
FIG. 14 illustrates operation of an alternative embodiment component mounter.

The above describes an embodiment, detailed forms are not limited to the above embodiment. In an alternative embodiment, as shown in FIG. 14, RF tag 61 is attached to board 10. In FIG. 14, for configurations similar to the above description, the same reference symbols are used and descriptions are omitted. Information is written to RF tag 61 by RFID (Radio Frequency IDentification). RF tag 61 is provided with a memory section (not shown), and the written information is memorized in the memory section. Also, head 40 is provided with communication section 407 that performs information communication with RF tag 61. Control section 401 of head 40 writes information to RF tag 61 in a non-contact manner via communication section 407. Control section 401 of head 40 writes the characteristic value of first component 11 and the resistance value of second component 12 to RF tag 61. Note that, RFID technology is well known, so detailed descriptions are omitted.

Also, in the above embodiment, second component 12 of a digital potentiometer is provided with memory section 122, but the configuration is not limited to this. In another embodiment, the digital potentiometer may not be provided with memory section 122.

Also, in the above embodiment, the characteristic value of first component 11 is sent and received by wired communication via communication pad 22 of characteristic value measuring device 20 and receiver probe 43 of head 40, but the configuration is not limited to this. Sending and receiving of the characteristic value of first component 11 is not limited to being performed by wired communication and may be performed by wireless communication. For example, characteristic value measuring device 20 and head 40 may each be provided with an antenna (not shown), and sending and receiving of the characteristic value of first component 11 may be performed by wireless communication using the antennae.

Also, in the above embodiment, the resistance value of the second component is sent and received by wired communication via sender probe 44 of head 40 and receiver terminal 101 of second component 12, but the configuration is not limited to this. Sending and receiving of the resistance value of the second component is not limited to being performed by wired communication and may be performed by wireless communication. For example, head 40 and second component 12 may each be provided with an antenna (not shown), and sending and receiving of the resistance value of the second component may be performed by wireless communication using the antennae.

The above describes details of specific examples of the present invention, but these are only examples and in no way restrict the claims of the invention. The techniques disclosed in the claims include various changes and modifications to the specific examples illustrated above. Technical elements described in this specification and in the drawings exhibit technical utility alone or in various combinations, and are not limited to the combination of the described aspects of the application. Also, the examples of the techniques in this specification and the figures achieve multiple purposes at the same time, but also exhibit technical utility when achieving one among those purposes.

REFERENCE SIGNS LIST

1: component mounter; 10: board; 11: first component; 12: second component; 20: characteristic value measuring device; 21: measurement stage; 22: communication pad; 23: base; 30: conveyor; 40: head; 41: nozzle; 43: receiver probe; 44: sender probe; 45: power source probe; 50: feeder; 51: reel; 52: sprocket; 53: tape; 61: RF tag; 62: writer; 101: receiver terminal; 102: power source terminal; 121: control section; 122: memory section; 123: receiver section; 124: variable resistance section; 401: control section; 402: memory section; 403: receiver section; 404: sender section; 405: power source; 407: communication section

The invention claimed is:

1. A component mounter comprising:
a characteristic value measuring device that measures a characteristic value of a first component; and
a head configured to mount the first component and a second component on a board;
wherein
the second component is a digital potentiometer provided with a receiver section configured to receive information from the head, a variable resistance section for which a resistance value is variable, and a control section configured to control the resistance value of the variable resistance section,
the head is provided with a head receiver section configured to receive information from the characteristic value measuring device, a sender section configured to send information to the second component, a power source configured to supply current to the variable resistance section, a memory section in which is memorized the resistance value of the second component corresponding to the characteristic value of the first component, and a control section,
and wherein
the control section of the head receives the characteristic value of the first component measured by the characteristic value measuring device from the characteristic value measuring device via the head receiver section, identifies the resistance value of the second component from the memory section based on the received characteristic of the first component, and sends the identified resistance value of the second component to the second component via the sender section,
the power source of the head supplies electric current to the variable resistance section of the second component, and
the control section of the head, with respect to the control section of the second component, receives the resistance value of the second component received from the head via the receiver section of the second component, and with electric current flowing in the variable resistance section, adjusts the resistance value of the variable resistance section based on the received resistance value of the second component.

2. The component mounter according to claim 1, wherein the head is provided with a power source probe connected to the power source, and the second component is provided with a power source terminal connected to the variable resistance section,
and wherein,
when the power source probe contacts the power source terminal, electric current flows from the power source to the variable resistance section.

3. The component mounter according to claim 1, wherein an RF tag is attached to the board, and the control section of the head writes the characteristic value of the first component and the resistance value of the second component to the RF tag.

4. The component mounter according to claim 1, wherein the memory section of the head memorizes a table in which the resistance value of the second component corresponding to the characteristic values of the first component is set in advance.

5. The component mounter according to claim 1, wherein the characteristic value measuring device is provided with a communication pad configured to send the characteristic value of the first component,
the head is provided with a receiver probe connected to the head receiver section, and
the characteristic value of the first component is sent from the characteristic value measuring device to the head when the receiver probe contacts the communication pad.

6. The component mounter according to claim 1, wherein the head is provided with a sender probe connected to the sender section,
the second component is provided with a receiver terminal connected to the receiver section of the second component, and
the resistance value of the second component is sent from the head to the second component when the sender probe contacts the receiver terminal.

* * * * *